US008363141B2

(12) United States Patent
Shinohara

(10) Patent No.: US 8,363,141 B2
(45) Date of Patent: Jan. 29, 2013

(54) SOLID-STATE IMAGE PICKUP DEVICE, IMAGE PICKUP SYSTEM INCLUDING THE SAME, AND METHOD FOR MANUFACTURING THE SAME

(75) Inventor: Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 228 days.

(21) Appl. No.: 12/815,236

(22) Filed: Jun. 14, 2010

(65) Prior Publication Data

US 2010/0321518 A1 Dec. 23, 2010

(30) Foreign Application Priority Data

Jun. 18, 2009 (JP) ................................. 2009-145445

(51) Int. Cl.
*H04N 5/335* (2011.01)
(52) U.S. Cl. ....................................... 348/308; 348/301
(58) Field of Classification Search .................. 348/294, 348/300.301, 308; 257/222, 292, 461; 438/48
See application file for complete search history.

(56) References Cited

U.S. PATENT DOCUMENTS

| 7,687,831 | B2 * | 3/2010 | Fujita et al. | 257/222 |
| 7,910,964 | B2 * | 3/2011 | Kawahito et al. | 257/292 |
| 8,120,684 | B2 * | 2/2012 | Arakawa | 348/306 |
| 2001/0006237 | A1 * | 7/2001 | Abe | 257/215 |
| 2003/0209712 | A1 | 11/2003 | Fujita | |

FOREIGN PATENT DOCUMENTS

| JP | 2002-231924 A | 8/2002 |
| JP | 2003-258232 A | 9/2003 |

* cited by examiner

*Primary Examiner* — Tuan Ho
(74) *Attorney, Agent, or Firm* — Canon U.S.A., Inc. IP Division

(57) ABSTRACT

A solid-state image pickup device including a photoelectric conversion element, a floating diffusion, and an element isolation region that are disposed above a first semiconductor region has a second semiconductor region of a first conductivity type disposed on the first semiconductor region. An interface between the first semiconductor region and a portion of the second semiconductor region corresponding to the photoelectric conversion element is located at a first depth, whereas the interface between the first semiconductor region and a portion of the second semiconductor region disposed under the element isolation region and the floating diffusion is located at a second depth smaller than the first depth.

8 Claims, 8 Drawing Sheets

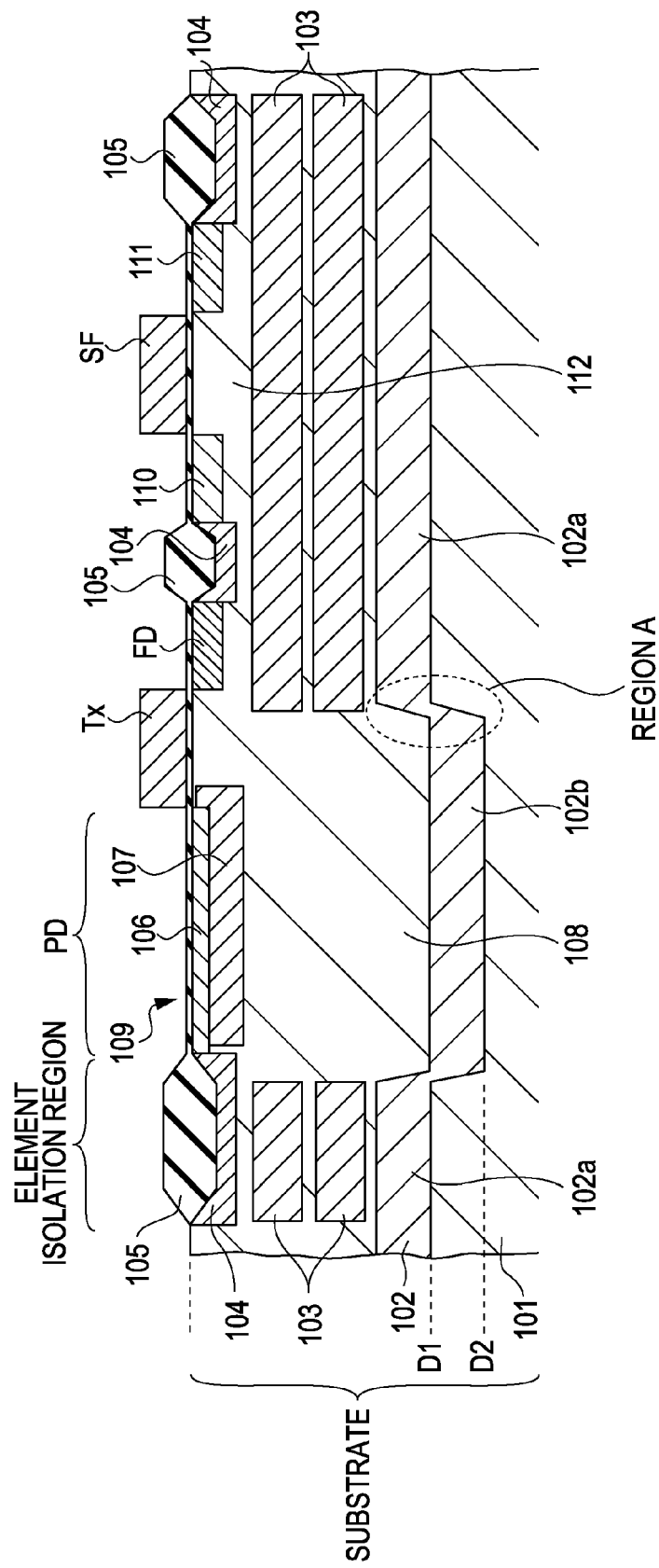

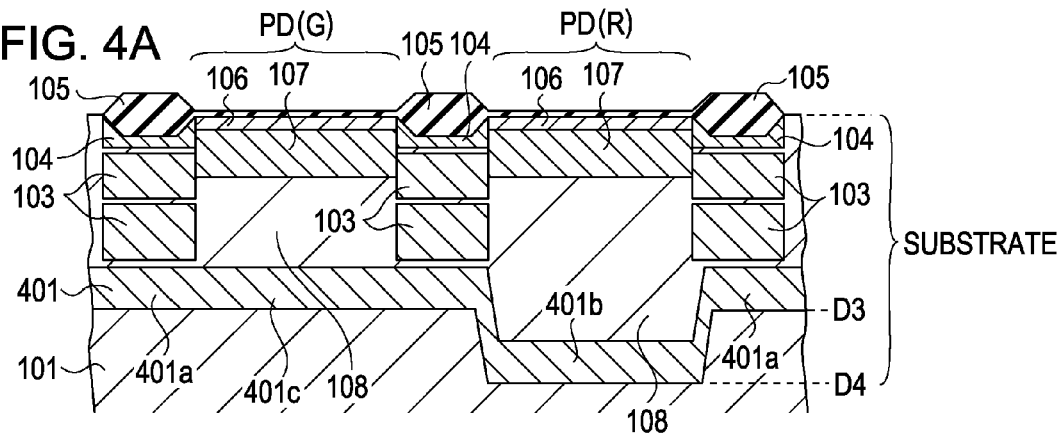
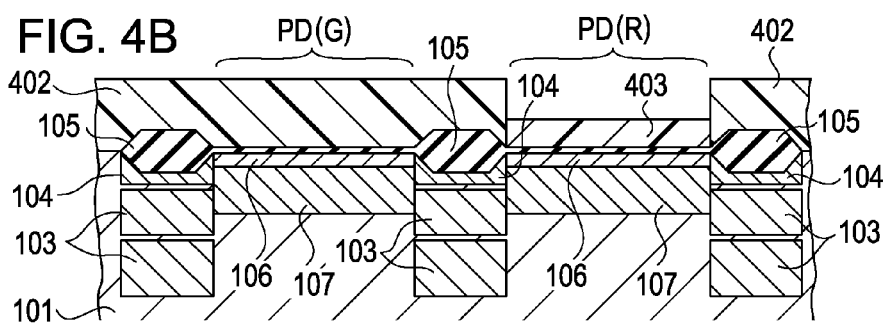
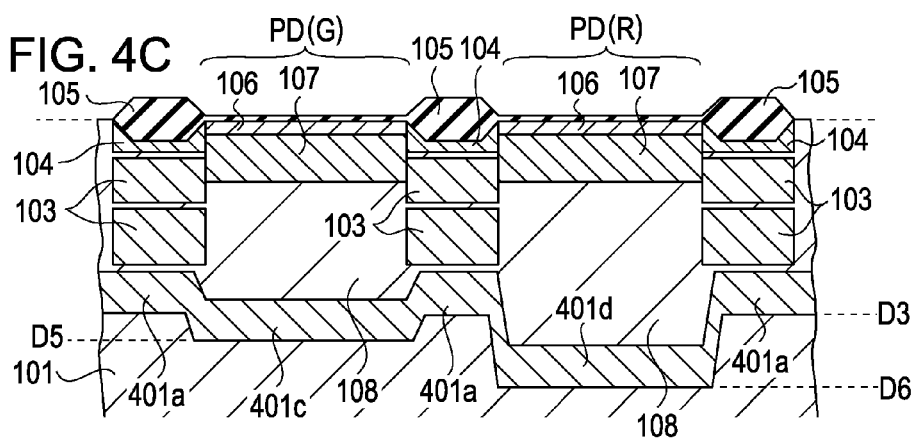
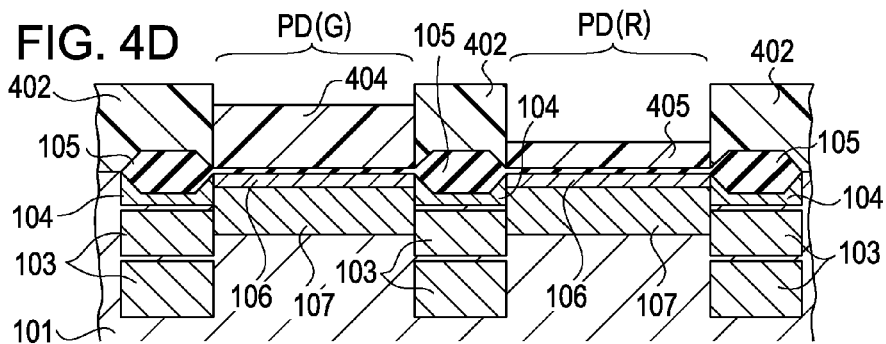

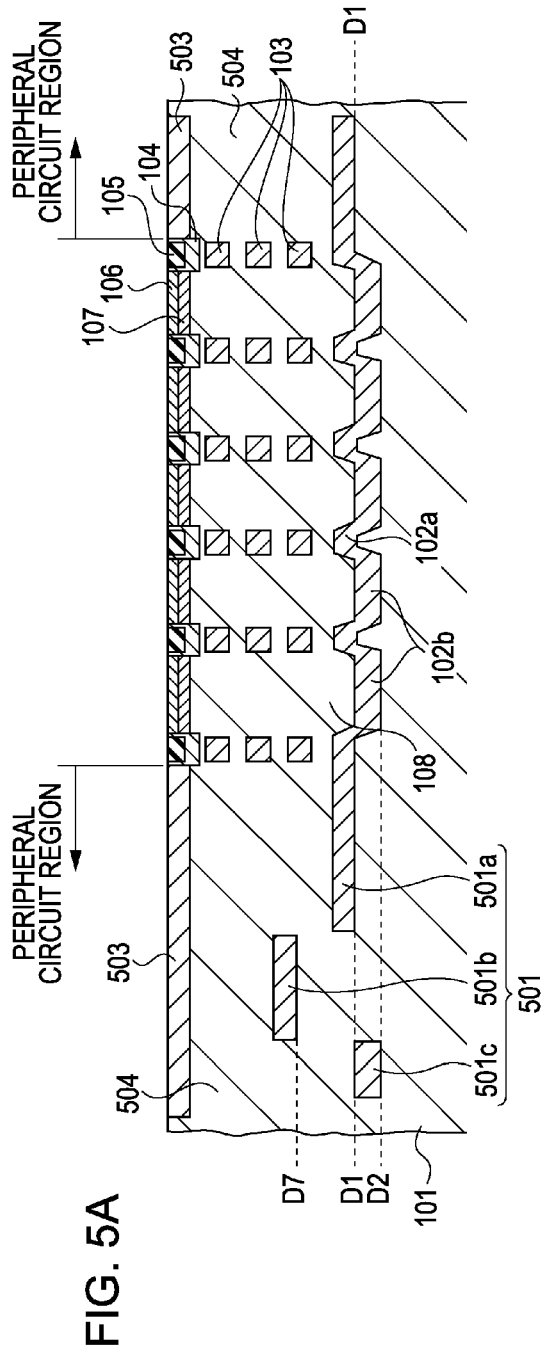
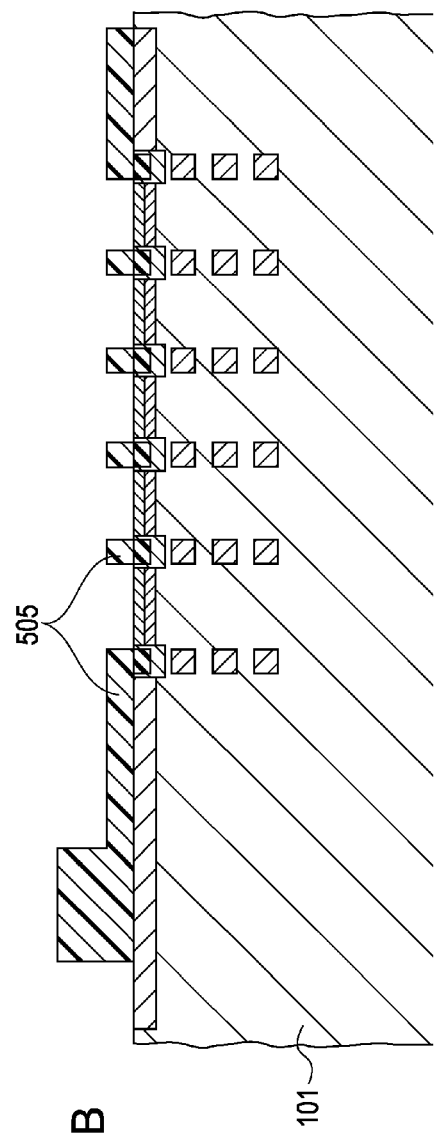

SOLID-STATE IMAGE PICKUP DEVICE, IMAGE PICKUP SYSTEM INCLUDING THE SAME, AND METHOD FOR MANUFACTURING THE SAME

BACKGROUND OF THE INVENTION

1. Field of the Invention

The present invention relates to a structure for isolating photoelectric conversion elements in solid-state image pickup devices.

2. Description of the Related Art

Digital still cameras and camcorders use two-dimensional solid-state image pickup devices such as charge coupled devices (CCD) or amplification-type MOS imagers. Japanese Patent Laid-Open No. 2003-258232 discloses a configuration for improving sensitivity of amplification-type MOS solid-state image pickup devices.

More specifically, Japanese Patent Laid-Open No. 2003-258232 discloses a solid-state image pickup device including a pixel transistor and a photodiode (hereinafter, referred to as a PD) serving as a photoelectric conversion element. The pixel transistor and the PD are provided in an n-type semiconductor region formed on a p-type semiconductor well region to improve sensitivity. Japanese Patent Laid-Open No. 2003-258232 further discloses a configuration including a first p-type semiconductor well region provided under a local oxidation of silicon (LOCOS) layer, and a second p-type semiconductor well region provided under the first p-type semiconductor well region.

The second p-type semiconductor well region is patterned to be smaller and to be spaced farther from the PD than the first p-type semiconductor well region not to suppress the depletion layer area of the PD. Accordingly, the structure improves the sensitivity of the PD.

However, the inventor found the following disadvantages of the configuration disclosed in Japanese Patent Laid-Open No. 2003-258232. The further the pixel is scaled down, the harder the pixel keeps its sensitivity or its isolation performance because of the difficulties of forming the second p-type semiconductor well.

The problem is attributed to the demand for the photoresist thick enough for forming the deep semiconductor region with high energy ion implantation. When the pixel is small, the width of the second semiconductor well region formed under an isolation region must be scaled down. Accordingly, the ratio of the thickness to the width of the photoresist, i.e., the aspect ratio of the opening pattern of the photoresist, increases. To form such a photoresist pattern with large aspect ratio becomes difficult.

Furthermore, the p-type semiconductor well region under the n-type semiconductor region is desired to be formed at a deeper position to keep its sensitivity even when the pixel size is small. However, the second p-type semiconductor well region is hard to correspond to the depth since ion implantation at a high energy level is not available because of the difficulty of the photoresist pattern with the sufficient aspect ratio. If the p-type semiconductor well region under the n-type semiconductor region only deepens, the charge generated in the PD may flow into adjacent pixels, because the p-type semiconductor well region cannot be connected to the second p-type semiconductor well region.

Even if the p-type semiconductor well region can be connected to the second p-type semiconductor well region, charge generated at a deep part of the semiconductor substrate under an element isolation region may easily diffuse into adjacent pixels.

SUMMARY OF THE INVENTION

According to an aspect of the present invention, a solid-state image pickup device includes: an element isolation region; a plurality of unit cells; and a first semiconductor region. Each of the plurality of unit cells includes a photoelectric conversion element, a transfer gate electrode configured to transfer charge generated in the photoelectric conversion element, a floating diffusion configured to store the transferred charge, and an amplifying transistor having a gate electrode connected to the floating diffusion. The element isolation region and the plurality of unit cells are disposed above the first semiconductor region. The photoelectric conversion element includes a second semiconductor region of a first conductivity type, a third semiconductor region of a second conductivity type configured to store the charge, and a fourth semiconductor region of the second conductivity type having an impurity concentration lower than the third semiconductor region. The semiconductor regions are arranged in the order the third, fourth, and second semiconductor regions from a light receiving surface. The second semiconductor region includes a portion constituting the photoelectric conversion element and a portion disposed under the element isolation region and the floating diffusion. The first semiconductor region is disposed under the second semiconductor region and has an interface with the second semiconductor region.

Further features of the present invention will become apparent from the following description of exemplary embodiments with reference to the attached drawings.

BRIEF DESCRIPTION OF THE DRAWINGS

FIG. 1 is a schematic sectional view illustrating a solid-state image pickup device according to a first exemplary embodiment of the present invention.

FIGS. 4A-4D are schematic sectional views for illustrating a method for manufacturing a solid-state image pickup device according to a third exemplary embodiment of the present invention.

FIGS. 5A and 5B are schematic sectional views for illustrating a solid-state image pickup device according to a fourth exemplary embodiment of the present invention.

The accompanying drawings, which are incorporated in and constitute a part of the specification, illustrate exemplary embodiments of the invention and, together with the description, serve to explain the principles of the invention.

DESCRIPTION OF THE EMBODIMENTS

In each of solid-state image pickup devices according to exemplary embodiments of the present invention, a photoelectric conversion element, a floating diffusion for receiving charge generated in and transferred from the photoelectric conversion element, and an element isolation region for electrically isolating the photoelectric conversion element from other elements are disposed above a first semiconductor region. The solid-state image pickup device includes a second semiconductor region of a first conductivity type on the first semiconductor region. An interface between the second semiconductor region and the first semiconductor region is located at a first depth in a region where the photoelectric conversion element is formed, whereas the interface is located at a second depth smaller than the first depth under the element isolation region and the floating diffusion. Such a configuration can suppress cross talk between adjacent pixels or other elements, keeping sensitivity of the photoelectric conversion element even if the pixels are miniaturized. The solid-state image pickup devices according to exemplary embodiments of the present invention will be described in detail below with reference to the accompanying drawings.

Figure 6:
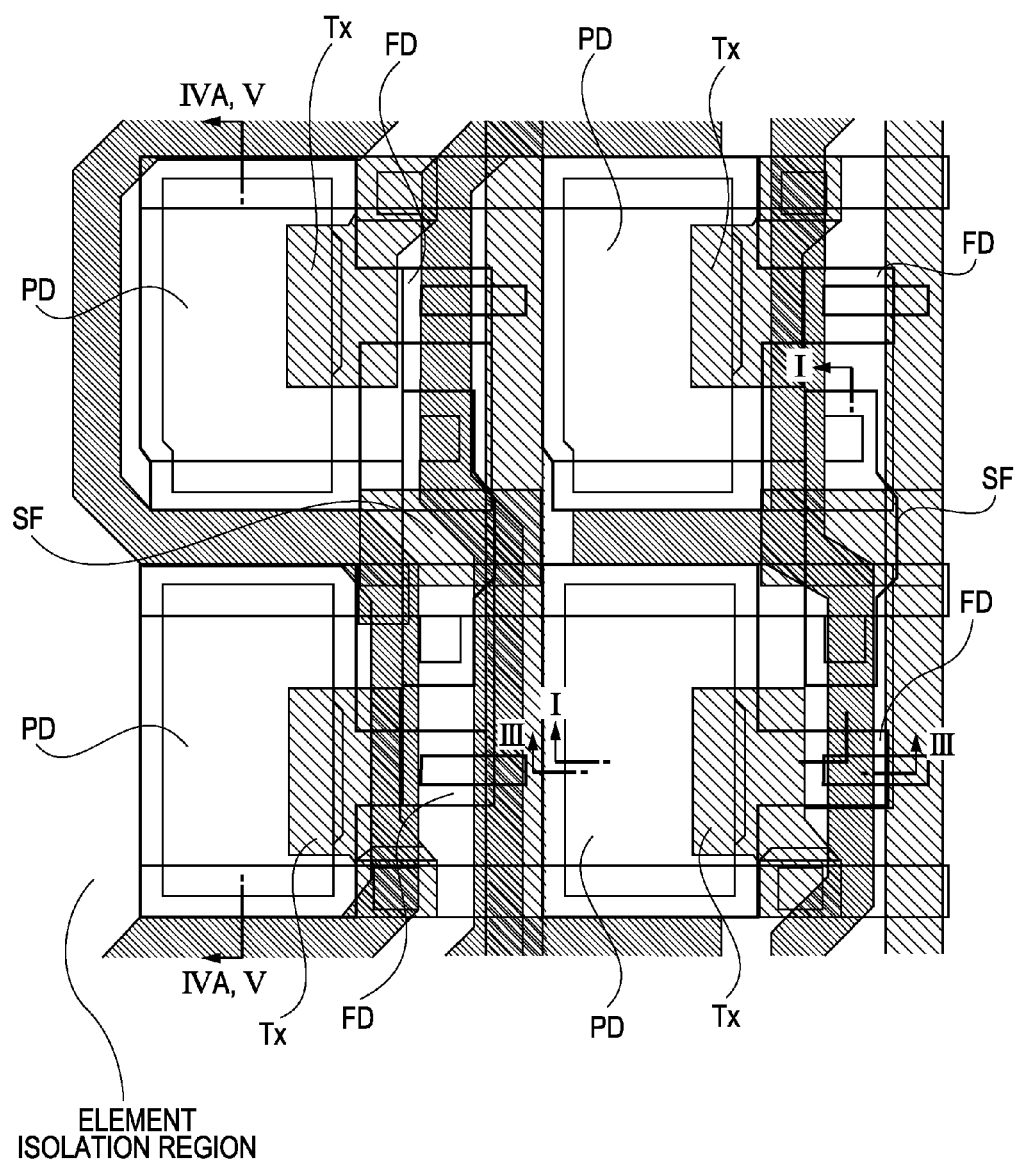
FIG. 6 is a schematic plan view for illustrating the solid-state image pickup device according to the first exemplary embodiment of the present invention.
Figure 7:
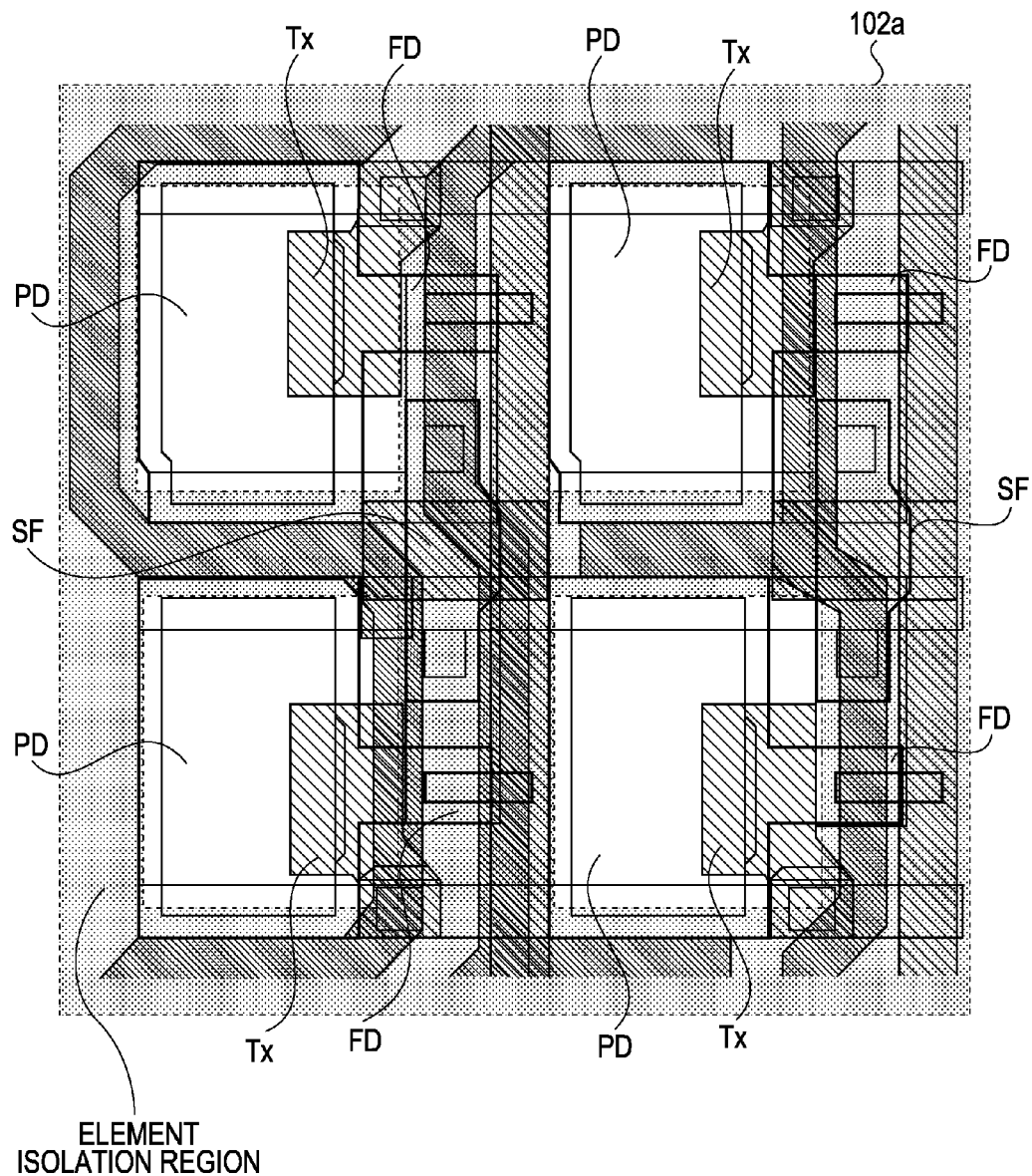
FIG. 7 is a schematic plan view for illustrating the solid-state image pickup device according to the first exemplary embodiment of the present invention.

A solid-state image pickup device according to a first exemplary embodiment will be described with reference to FIGS. 1, 6, and 7. FIG. 6 is a schematic plan view of the solid-state image pickup device. FIG. 1 is a diagram schematically illustrating a section taken along line I-I shown in FIG. 6. In the description of the first exemplary embodiment, the first and second conductivity types indicate a p-type and an n-type, respectively. Additionally, in this exemplary embodiment, electrons generated in a PD are referred to as signal charge (hereinafter, also referred to as charge).

A configuration of the solid-state image pickup device will now be described with reference to FIG. 6. The solid-state image pickup device according to the first exemplary embodiment is of an amplification-type MOS. The amplification-type MOS solid-state image pickup device at least includes a photoelectric conversion element, a transfer transistor, an amplifying transistor, and a reset transistor. FIG. 6 illustrates four photoelectric conversion elements (e.g., photodiodes PD) and four transfer gate electrodes TX of the transfer transistors. Each of the photoelectric conversion elements PD converts incident light into charge and accumulates the charge. Each of the four transfer gate electrodes TX transfers the charge generated and accumulated in the corresponding photoelectric conversion element PD. FIG. 6 further illustrates elements other than the photoelectric conversion elements PD: floating diffusions (hereinafter, abbreviated as FD) for receiving and storing the charge transferred by the corresponding transfer transistors, and gate electrodes SF of the amplifying transistors each connected to the corresponding FD. Herein, a configuration including at least one photoelectric conversion element PD and one amplifying transistor is referred to as a unit cell. In FIG. 6, one unit cell includes two photoelectric conversion elements PD and one amplifying transistor. That is, the unit cell in FIG. 6 includes two pixels (each containing one PD). An element isolation region is disposed over a region except for diffusion regions of the elements. The element isolation region includes a structure for preventing signal charge and potential change from moving and propagating between elements, respectively.

FIG. 1 is a schematic sectional view taken along line I-I passing through the PD and the amplifying transistor illustrated in FIG. 6. In FIG. 1, like reference characters designate configurations having the same or similar functions as those illustrated in FIG. 6, and wirings and contacts illustrated in FIG. 6 are omitted. FIG. 1 illustrates a first n-type semiconductor region 101 and a second p-type semiconductor region 102 disposed on the first semiconductor region 101. An element isolation 105 is composed of an insulator disposed in an element isolation region. The element isolation 105 can be an oxide such as a LOCOS or a shallow trench isolation (STI), or other structure using diffusion layer. Potential barriers 103 are constituted by fifth p-type semiconductor regions disposed under the element isolation 105. A p-type channel stop region 104 is disposed under the element isolation 105. The element isolation region includes the element isolation 105, the potential barriers 103, and the channel stop region 104. FIG. 1 also illustrates a p-type surface protection layer 106, a third n-type semiconductor region 107, and a fourth n-type semiconductor region 108 having an impurity concentration lower than the third semiconductor region 107. The surface protection layer 106, the third semiconductor region 107, the fourth semiconductor region 108, and the second semiconductor region 102 are sequentially arranged in this described order from a light receiving surface 109 to constitute the PD. FIG. 1 further illustrates the amplifying transistor having a source 110 and a drain 111. The potential barriers 103 are disposed under the amplifying transistor and thus serve as p-type potential barriers that allow the amplifying transistor to operate. Since the potential barriers 103 disposed under the amplifying transistor extends under the element isolation 105 and the FD, the potential barriers 103 have functions for isolating the elements and decreasing signal charge flowing into the FD. Additionally, FIG. 1 illustrates an n-type semiconductor region 112 and the second semiconductor region 102 including a first portion 102a and a second portion 102b.

A PN junction interface is formed between the second semiconductor region 102 and the first semiconductor region 101. The second semiconductor region 102 includes the first portion 102a whose PN junction interface is located at a first depth D1 and the second portion 102b whose PN junction interface is located at a second depth D2 greater than the first depth D1. The first and second portions 102a and 102b are continuously formed, and the difference between the depths thereof is approximately 1-2 μm. The first portion 102a can be both electrically connected to the second portion 102b and arranged in the element isolation region while the second portion 102b is arranged at a deep position for the PD. Accordingly, it is possible to decrease the signal charge flowing into adjacent pixels while keeping sensitivity of the PD high. Hereinafter, the depth of the second semiconductor region 102 is defined as the depth of the lower surface of the second semiconductor region 102, i.e., the interface between the second semiconductor region 102 and the first semiconductor region 101 (the interface may be a PN junction interface if the conductivity types differ).

The second portion 102b is disposed in the region for the PD, whereas the first portion 102a is disposed in a region except for the region including the second portion 102b, i.e., under the element isolation 105, the FD, and the amplifying transistor. More specifically, the first portion 102a is disposed as illustrated in FIG. 7. FIG. 7, illustrating the same plan view as that illustrated in FIG. 6, includes the disposed first portion 102a. The first portion 102a is arranged around the PD and extends under the FD to prevent signal charge accumulated in the PD from leaking. The first portion 102a also extends under the other transistors, such as the amplifying transistor. The arrangement can decrease signal charge flowing into other elements including the FD and can keep sensitivity of the PD. The first portion 102a, functioning as a potential barrier, serves as a part of the element isolation region.

The second portion 102b constitutes part of the PD and functions as a potential barrier for electrically isolating the third and fourth semiconductor regions 107 and 108 from the first semiconductor region 101. The second portion 102*b* disposed at a deep part of a substrate improves sensitivity of the PD.

When light reaches a deep part of the semiconductor substrate under the element isolation region and generates signal charge in the first semiconductor region 101, the first portion 102*a* can decrease the signal charge flowing into the third semiconductor region 107 accumulating signal charge. If the first portion 102*a* is formed at the same depth as the second portion 102*b*, the signal charge there may flow into PDs of adjacent pixels to cause cross talk. Since the solid-state image pickup device according to the first exemplary embodiment allows charge generated at a deep part of the element isolation region to flow more easily to the substrate side, the solid-state image pickup device, keeping its sensitivity, can suppress cross talk. The deep part of the semiconductor substrate under the element isolation region indicates a part under the element isolation 105 and the potential barriers 103. Additionally, since the first portion 102*a* extends under the lower surfaces of the FD and other transistors, it is possible to decrease flowing of charge generated at the deep part of the semiconductor substrate under the other elements including the FD into the other elements.

The second semiconductor region 102 has a region (a region A illustrated in FIG. 1) where the depth of the second semiconductor region 102 continuously changes from the depth of the first portion 102*a* to that of the second portion 102*b*. The region A allows the saturated charge to flow more easily to the substrate side because the potential barrier height of the region A can be designed to be lower than that of the flat part of the second semiconductor region 102. The solid-state image pickup device according to the first exemplary embodiment allows the cross talk charge or the overflow charge to flow out easily to the substrate side to decrease blooming and cross talk (including color cross talk). The region A may be disposed under the transfer gate electrode TX.

Figure 2A:
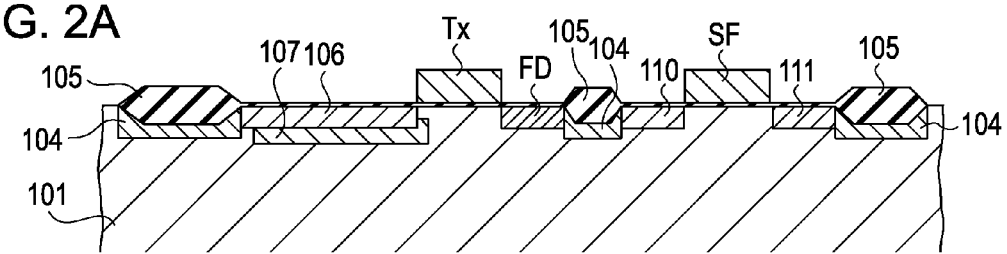
FIGS. 2A-2D are schematic sectional views for illustrating a method for manufacturing the solid-state image pickup device according to the first exemplary embodiment of the present invention.

A method for manufacturing the solid-state image pickup device according to the first exemplary embodiment is described with reference to FIGS. 2A-2D. As illustrated in FIG. 2A, the first semiconductor region 101 is formed on a substrate. The element isolation 105, the channel stop region 104, the gate electrodes (not illustrated except for TX and SF), the semiconductor region 107 for the PD, the FD, and the source 110 and drain 111 of the amplifying transistor are also formed.

Figure 2B:
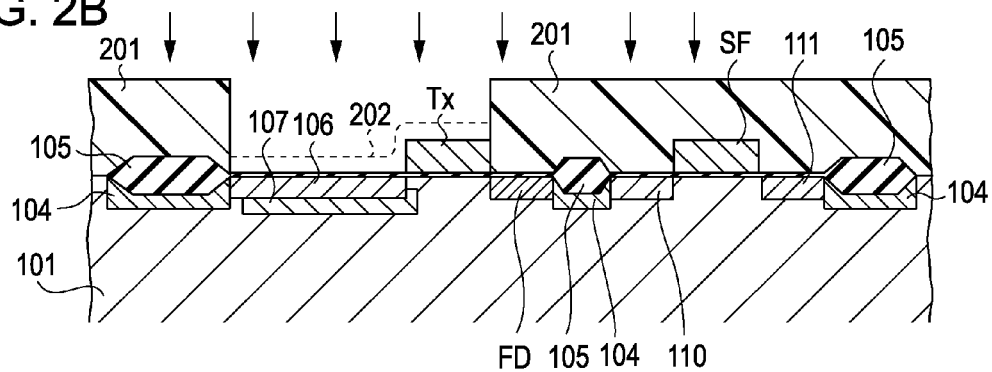
Figure 2C:
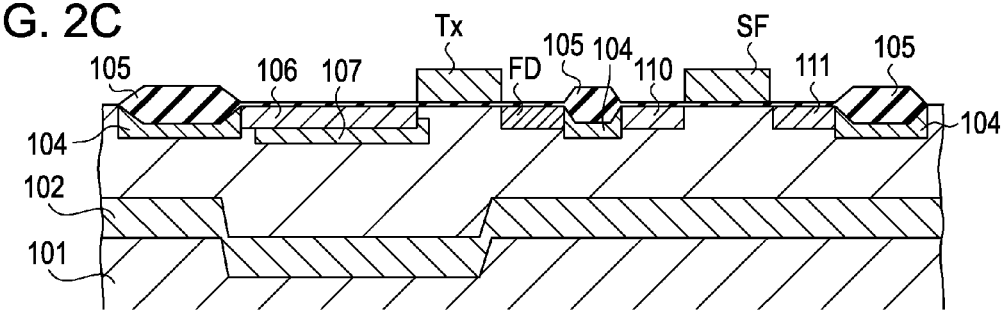
Figure 2D:
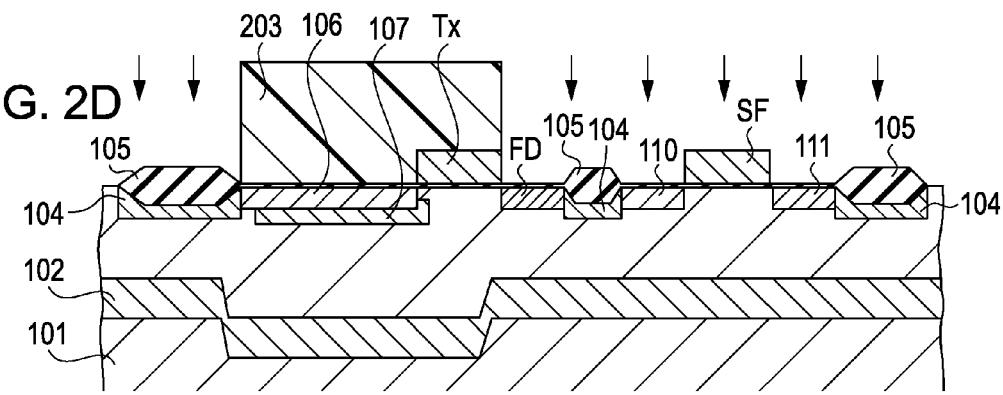

A photoresist pattern 201 illustrated in FIG. 2B is then formed on a region except for that for the PD, such as a region including the element isolation 105. Since the photoresist pattern 201 can be formed with a general photolithography technique, a description thereof is omitted. To form the second p-type semiconductor region 102 in the entire substrate, boron ions, for example, are implanted as illustrated by arrows. To locate peaks of impurity concentrations of the first and second portions 102*a* and 102*b* at depths of 2-3 μm and 3-4 μm, respectively, the photoresist pattern 201 is formed to have thickness of about 1 μm, provided that it has about the same ion stopping ability as that of the semiconductor substrate. The photoresist pattern 201 may be replaced by a pattern of a material other than the photoresist, e.g., polysilicon. After the impurity ion is implanted through the photoresist pattern 201 to form the region 102, the photoresist pattern 201 is then removed (see FIG. 2C). A modified example illustrated in FIG. 2B shows the thinner photoresist 202 formed on the PD than the photoresist 201.

A photoresist pattern 203 for the PD is then formed. Boron ions, for example, are implanted a plurality of times at different energy levels to form the fifth p-type semiconductor regions 103 (see FIG. 2D). At this time, the photoresist pattern 203 is formed to have an enough thickness to stop the ions from passing through. In this step, the potential barriers 103 constituted by a plurality of semiconductor regions are formed. The photoresist pattern 203 is then removed. In this way, the configuration illustrated in FIG. 1 is formed.

A comparative case is now discussed in which the second semiconductor region 102 has the uniform depth of the second portion 102*b* told hereinbefore when width of the element isolation region is 0.5 μm. To form the semiconductor regions 103 with the depth of about 3 um, a photoresist having thickness of 4-5 μm has to be formed so that the aperture is located only at the element isolation region. In this case, an aspect ratio of the opening of the photoresist pattern is equal to ⅛ or larger. However, since the method for manufacturing the solid-state image pickup device according to the first exemplary embodiment can decrease the thickness of the photoresist pattern, because the semiconductor region 102*a* serves as the deepest layer of the potential barriers 103.

Although the substrate, the first semiconductor region 101, and the fourth semiconductor region 108 are of n-type in this exemplary embodiment, they may be of p-type. The fourth semiconductor region 108 may be a p-type semiconductor region having a low impurity concentration. Furthermore, the semiconductor regions described in this exemplary embodiment may have opposite conductivity types. The configuration of the unit cell is not limited to that illustrated in FIG. 6, and any configuration can be adopted.

Figure 3:
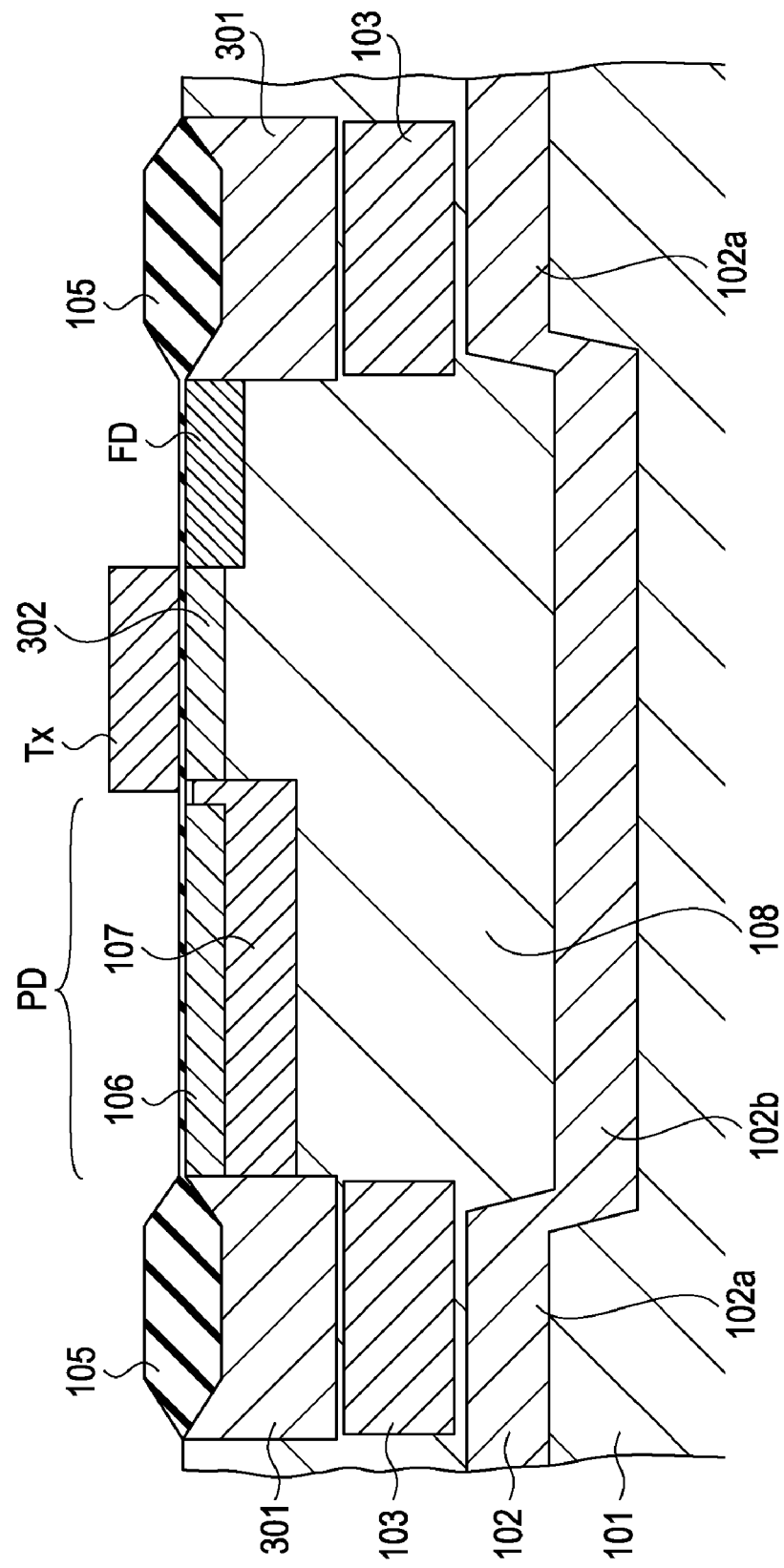
FIG. 3 is a schematic sectional view for illustrating a solid-state image pickup device according to a second exemplary embodiment of the present invention.

FIG. 3 is a schematic sectional view of a solid-state image pickup device according to a second exemplary embodiment of the present invention and corresponds to a section taken along line III-III illustrated in FIG. 6. A description regarding configurations similar to those described in the first exemplary embodiment is omitted by attaching like reference characters to those configurations. In the second exemplary embodiment, the channel stop region 104 and part of the potential barriers 103 described in the first exemplary embodiment are constituted by a single semiconductor region 301. Such a configuration can reduce the number of times of ion implantation.

An n-type semiconductor region 302 is provided near a gate insulating film under a transfer gate electrode TX. The semiconductor region 302 can improve charge transfer efficiency. Additionally, in the second exemplary embodiment, the first portion 102*a* is not formed under the FD unlike the first exemplary embodiment. However, the first portion 102*a*, instead of the second portion 102*b*, is preferably disposed under the FD to decrease flowing of signal charge into the FD.

FIG. 4A is a schematic sectional view of a solid-state image pickup device according to a third exemplary embodiment and corresponds to a section taken along line IVA-IVA illustrated in FIG. 6. A description regarding configurations similar to those described in the first exemplary embodiment is omitted by attaching like reference characters to those configurations illustrated in FIG. 1. In the third exemplary embodiment, which is a modification of the first exemplary embodiment, a color filter layer of primary colors is arranged on each PD. The color filter layer includes color filters of a first color, a second color, and a third color. More specifically, the color filter layer includes color filters of red (R), blue (B), and green (G) and forms a Bayer array. FIGS. 4A-4D illustrate PDs for the green (G) and red (R) color filters. In the third exemplary embodiment, the arrangement of the second semiconductor region 102 differs from that of the first exemplary embodiment. More specifically, the position of the interface between the second semiconductor region 102 and the first semiconductor region 101 alters for each PD in accordance with wavelength of light reaching the PD through the color filter. A detailed explanation is given below.

In the third exemplary embodiment, a p-type semiconductor region 401 corresponds to the second semiconductor region 102 according to the first exemplary embodiment. The p-type semiconductor region 401 includes semiconductor regions (hereinafter, referred to as first to third portions, respectively) 401a-401c. The first portion 401a is disposed at a depth D3 of a substrate under the element isolation region. The third portion 401c is disposed as deep as the first portion 401a, i.e., at the depth D3, for the PD having a green filter (i.e., PD(G)). The second portion 401b is disposed at a depth D4 greater than the depth D3 for the PD having a red filter (i.e., PD(R)). Accordingly, the depths of the second and third portions 401b and 401c alter in accordance with wavelength of light reaching the corresponding PDs. Since the depth of the substrate showing high photoelectric conversion efficiency for the wavelength of the incident light can be utilized as the PD, such a configuration improves sensitivity of the PD. The depth can be determined by the wavelength of the incident light and an absorption coefficient of the substrate where photoelectric conversion occurs.

The configuration illustrated in FIG. 4A can be formed with a manufacturing method similar to that described in the first exemplary embodiment. A step corresponding to that illustrated in FIG. 1B will be described with reference to FIG. 4B. When the p-type semiconductor region 401 is formed by ion implantation, thickness of a photoresist pattern is changed in accordance with the depth. For example, in FIG. 4B, a photoresist pattern 402 having first thickness is arranged on a region where the element isolation 105 and the PD(G) are to be formed. A photoresist pattern 403 having second thickness smaller than the first thickness is arranged on a region where the PD(R) is to be formed. The first thickness and the second thickness are set so that a peak of the impurity concentration is located at a desired depth after ion implantation. Boron ions are implanted and the photoresist patterns 402 and 403 are then removed, whereby the semiconductor region 401 illustrated in FIG. 4A is formed. The photoresist pattern 403 may be omitted. Omission of the photoresist pattern 403 can decrease the number of steps.

A modification of the third exemplary embodiment will be further described with reference to FIGS. 4C and 4D. Unlike FIG. 4A illustrating the first and third portions 401a and 401c disposed at the same depth D3, FIG. 4C illustrates the first portion 401a disposed at the depth D3, the third portion 401c disposed at a depth D5, and a semiconductor region (hereinafter, referred to as a fourth portion) 401d disposed at a depth D6. The depths D3, D5, and D6 differ from one another. Such a configuration allows charge to be emitted more easily in the element isolation region while optimizing sensitivity of PDs for respective colors of the color filter layer.

A method for manufacturing the configuration illustrated in FIG. 4C will be described with reference to FIG. 4D. A description regarding steps similar to those of the method described in the first exemplary embodiment is omitted. FIG. 4D illustrates a schematic sectional view of the solid-state image pickup device at a step of the manufacturing method corresponding to the step illustrated in FIG. 2B. The photoresist pattern 402 is disposed on the element isolation 105 and the FD (not illustrated). A photoresist pattern 404 is disposed on a region where the PD(G) is to be formed. A photoresist pattern 405 is disposed on a region where the PD(R) is to be formed. When the photoresist pattern 402 has first thickness, the photoresist pattern 404 has second thickness smaller than the first thickness and the photoresist pattern 405 has third thickness smaller than the second thickness. By disposing such photoresist patterns 402-405 and implanting ions to form a p-type semiconductor region, the p-type semiconductor region 401 illustrated in FIG. 4C can be formed. Thereafter, a photoresist pattern is formed at an appropriate place to form the potential barriers 103. Since the following steps are similar to those described in the first exemplary embodiment, a description thereof is omitted. Even if the photoresist pattern 405 is omitted in FIG. 4D, the similar configuration can be formed. Omission of the photoresist pattern 405 can decrease the number of steps.

In a fourth exemplary embodiment, a configuration of the second semiconductor region 102 according to the first exemplary embodiment in a peripheral circuit region will be described. FIGS. 5A and 5B are schematic sectional views of a solid-state image pickup device according to the fourth exemplary embodiment and illustrate a section of the peripheral circuit region taken along line V-V. The peripheral circuit region indicates a region where a circuit for generating a control signal for use in readout of signal charge from a PD and a circuit for processing the signal charge are arranged. Circuits arranged in the peripheral circuit region may be, for example, a scanning circuit, a timing generator, an amplifier, and an analog-to-digital (A/D) converter. Illustration of circuits arranged in the peripheral circuit region is omitted in FIGS. 5A and 5B. A description regarding configurations similar to those described in the first exemplary embodiment is omitted below by attaching, in FIGS. 5A and 5B, like reference characters to those configurations illustrated in FIG. 1.

Referring to FIG. 5A, a p-type semiconductor region 501 corresponds to the second semiconductor region 102 disposed in the peripheral circuit region. The p-type semiconductor region 501 includes semiconductor regions (hereinafter, referred to as first to third portions, respectively) 501a-501c. The first portion 501a is disposed at a depth D1. The third portion 501c is disposed at a depth D2 greater than the depth D1, whereas the second portion 501b is disposed at a depth D7 smaller than the depth D1. By setting a difference between the depth D7 and the depth D1 approximately to 3 μm or over, the first potion 501a can be electrically disconnected from the second portion 501b. The peripheral circuit region further includes a well 503 for peripheral circuits and an n-type semiconductor region 504. The first semiconductor region 101 can be electrically connected to the n-type semiconductor region 504 by the second portion 501b disposed at the depth D7. Since such a configuration allows voltage to be supplied from the first semiconductor region 101 to the peripheral circuit region, operations of circuits disposed in the peripheral circuit region can be stabilized. The number of the p-type potential barriers 103 is greater than that of the first exemplary embodiment. More specifically, the potential barriers 103 are constituted by three semiconductor regions.

The configuration illustrated in FIG. 5A can be formed with a manufacturing method similar to that of the first exemplary embodiment. More specifically, a photoresist pattern 505 illustrated in FIG. 5B is used at the step of forming the second semiconductor region 102 and the p-type semiconductor region 501 by ion implantation. Such a photoresist pattern 505 having altering thickness can be formed with a method using different photoresists, a method for adjusting sensitivity of the photoresist and exposure intensity, and a method for repeating application and patterning of the photoresist. The p-type potential barriers 103 are formed by performing ion implantation more than the number of times the ion implantation is performed in the first exemplary embodiment. A configuration without the second portion 501b can be formed by setting a photoresist pattern provided at a region originally containing the second portion 501b to have thickness that prevents ions from penetrating (passing through) the photoresist pattern before ion implantation. Such a configuration can also allow voltage to be supplied from the first semiconductor region 101 to the peripheral circuit region.

The configuration of the semiconductor region 501 according to this exemplary embodiment can be applied to other exemplary embodiments. When the semiconductor region 501 omitted in the peripheral circuit region, a thick photoresist pattern is formed on the peripheral circuit region before performing ion implantation for forming the second semiconductor region 102.

In a fifth exemplary embodiment, a description will be given with reference to FIG. 8 for an application of the solid-state image pickup devices having been described in the first to fourth exemplary embodiments to an image pickup system. The image pickup system indicates a digital still camera, a digital camcorder, and a digital camera for mobile phones.

Figure 8:
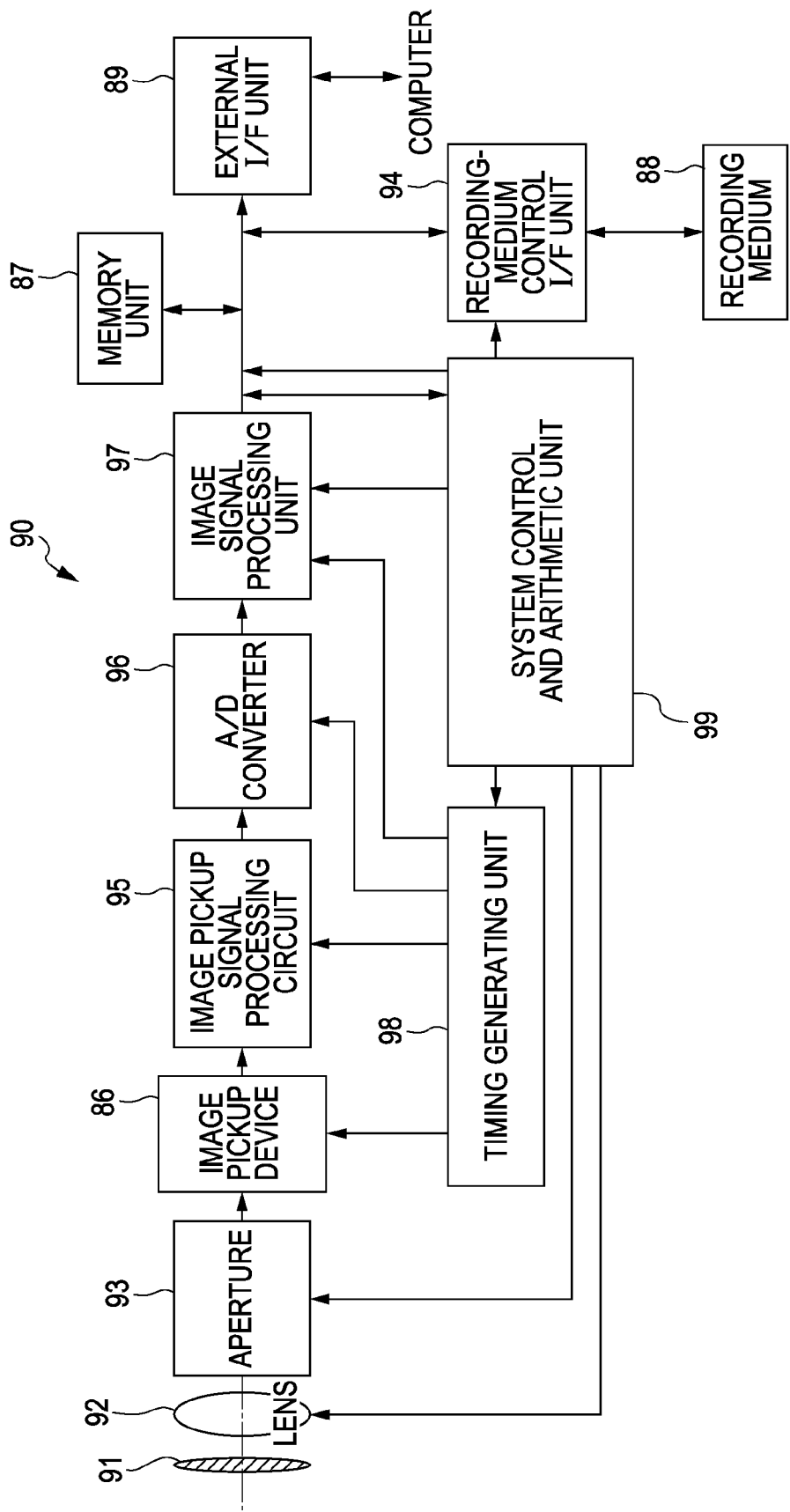
FIG. 8 is a block diagram for illustrating an image pickup system.

FIG. 8 is a block diagram of a digital still camera 90. An optical image of a subject is formed onto an image pickup surface of an image pickup device 86 by an optical system including a lens 92. The image pickup device 86 corresponds to each of the solid-state image pickup devices described in the first to fourth exemplary embodiments. A barrier 91 functioning as a main switch and a protector of the lens 92 may be provided on the outer side of the lens 92. The lens 92 may be equipped with an aperture 93 for adjusting quantity of light going out from the lens 92. An image pickup signal processing circuit 95 performs various correction operations and clamping on an image pickup signal output from the image pickup device 86. An analog-to-digital (A/D) converter 96 performs analog-to-digital conversion on the image pickup signal output from the image pickup signal processing circuit 95. An image signal processing unit (image processing unit) 97 performs various correction operations and data compression on the image data output from the A/D converter 96. The image pickup device 86, the image pickup signal processing circuit 95, the A/D converter 96, and the image signal processing unit 97 operate in accordance with a timing signal generated by a timing generating unit 98. A system control and arithmetic unit 99 controls each block. The digital still camera 90 also includes a memory unit 87 for temporarily storing image data and a recording-medium control interface (I/F) unit 94 for recording images on or reading images from a recording medium 88. The recording medium 88 including a semiconductor memory is removable. The digital still camera 90 may further include an external interface (I/F) unit 89 for communicating with external computers. The image pickup signal processing circuit 95, the A/D converter 96, and the image signal processing unit 97 may be formed on a chip including the image pickup device 86.

An operation of the digital still camera 90 illustrated in FIG. 8 will now be described. Main power supply, power supply of the control system, and power supply of the circuits of the image pickup system, such as the A/D converter 96, are sequentially turned on in response to opening of the barrier 91. The system control and arithmetic unit 99 then fully opens the aperture 93 to control an exposure amount. A signal output from the image pickup device 86 is supplied to the A/D converter 96 through the image pickup signal processing circuit 95. The A/D converter 96 performs A/D conversion on the signal and outputs the converted signal to the image signal processing unit 97. The image signal processing unit 97 processes the supplied data and provides the processed data to the system control and arithmetic unit 99. The system control and arithmetic unit 99 performs a calculation to determine the exposure amount. The system control and arithmetic unit 99 then controls the aperture 93 on the basis of the determined exposure amount. The system control and arithmetic unit 99 extracts high-frequency components from the signal having been output from the image pickup device 86 and processed by the image signal processing unit 97 to calculate a distance to the subject on the basis of the extracted high-frequency components. The system control and arithmetic unit 99 then drives the lens 92 to determine whether the image is in focus. If the system control and arithmetic unit 99 determines that the image is out of focus, the system control and arithmetic unit 99 drives the lens 92 again and calculates the distance. After the system control and arithmetic unit 99 determines that the image is in focus, actual exposure starts. After the exposure ends, an image pickup signal output from the image pickup device 86 is corrected by the image pickup signal processing circuit 95, is digitalized by the A/D converter 96, and is processed by the image signal processing unit 97. The system control and arithmetic unit 99 stores the image data processed by the image signal processing unit 97 in the memory unit 87. The image data stored in the memory unit 87 is then recorded on the recording medium 88 through the recording-medium control I/F unit 94 under control of the system control and arithmetic unit 99. The image data is also supplied to a computer through the external I/F unit 89 and is processed thereby. In such a manner, the image pickup devices according to the exemplary embodiments of the present invention are applied to an image pickup system.

As described above, the solid-state image pickup devices according to the exemplary embodiments of the present invention can suppress flowing of charge into adjacent pixels while maintaining sensitivity of photoelectric conversion elements even if the pixels are miniaturized.

The present invention is not limited to the configurations described in the exemplary embodiments. The semiconductor regions may have opposite conductivity types, and the configuration of the unit cell may be changed. Each exemplary embodiment can be optionally combined with one another.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-145445 filed Jun. 18, 2009, which is hereby incorporated by reference herein in its entirety.

What is claimed is:

1. A solid-state image pickup device comprising:
   a first semiconductor region;
   an element isolation region; and
   a plurality of unit cells, each including:
      a photoelectric conversion element;
      a transfer gate electrode configured to transfer charge generated in the photoelectric conversion element;
      a floating diffusion configured to store the transferred charge; and
      an amplifying transistor having a gate electrode connected to the floating diffusion,
   wherein the element isolation region and the plurality of unit cells are disposed above the first semiconductor region,
   wherein the photoelectric conversion element includes a second semiconductor region of a first conductivity type, a third semiconductor region of a second conductivity type configured to store the charge, and a fourth semiconductor region of the second conductivity type having an impurity concentration lower than the third semiconductor region; and the semiconductor regions are arranged in an order the third, fourth, and second semiconductor regions from a light receiving surface, and wherein the second semiconductor region includes a portion constituting the photoelectric conversion element and a portion disposed under the element isolation region and the floating diffusion, wherein the first semiconductor region is disposed under the second semiconductor region and has an interface with the second semiconductor region, and wherein the interface between the first semiconductor region and the portion of the second semiconductor region constituting the photoelectric conversion element is located at a first depth, whereas the interface between the first semiconductor region and the portion of the second semiconductor region under the element isolation region and the floating diffusion is located at a second depth smaller than the first depth.

2. The solid-state image pickup device according to claim 1, wherein the first semiconductor region is of the second conductivity type.

3. The solid-state image pickup device according to claim 1, further comprising:
a potential barrier composed of a fifth semiconductor region of the first conductivity type disposed on the second semiconductor region disposed under the element isolation region.

4. The solid-state image pickup device according to claim 3, wherein the potential barrier includes a plurality of semiconductor regions disposed at different depths.

5. The solid-state image pickup device according to claim 1, further comprising:
a color filter layer including a color filter disposed for each photoelectric conversion element, wherein
the depth of the interface between the first semiconductor region and the portion of the second semiconductor region constituting the photoelectric conversion element increases in proportion to wavelength of light passing through each color filter.

6. The solid-state image pickup device according to claim 5, wherein the color filter layer includes color filters of red, blue, and green.

7. The solid-state image pickup device according to claim 6, wherein the depth of the interface between the first semiconductor region and the portion of the second semiconductor region constituting the photoelectric conversion element increases in the order of the interface corresponding to the photoelectric conversion element for the blue color filter, the interface corresponding to the photoelectric conversion element for the green color filter, and the interface corresponding to the photoelectric conversion element for the red color filter.

8. The solid-state image pickup device according to claim 1, further comprising a signal processing circuit configured to process a signal supplied from the solid-state image pickup device.

* * * * *